United States Patent [19]

Nakazawa et al.

[11] Patent Number: 5,648,682

[45] Date of Patent: Jul. 15, 1997

[54] RESIN-SEALED SEMICONDUCTOR DEVICE AND LEAD FRAME USED IN A RESIN-SEALED SEMICONDUCTOR DEVICE

[75] Inventors: Tsutomu Nakazawa; Yumi Inoue, both of Yokohama, Japan

[73] Assignee: Kabushiki Kaisha Toshiba, Kawasaki, Japan

[21] Appl. No.: 542,027

[22] Filed: Oct. 12, 1995

[30] Foreign Application Priority Data

Oct. 15, 1994 [JP] Japan .................................. 6-275970

[51] Int. Cl.⁶ .................................................. H01L 23/495
[52] U.S. Cl. .................. 257/673; 257/692; 257/676; 257/737
[58] Field of Search ............................ 257/673, 676, 257/737, 692

[56] References Cited

U.S. PATENT DOCUMENTS

| | | | |
|---|---|---|---|
| 4,701,363 | 10/1987 | Barber | 257/673 |
| 4,707,418 | 11/1987 | Takiar et al. | 257/673 |
| 5,349,238 | 9/1994 | Ohsawa et al. | 257/673 |

FOREIGN PATENT DOCUMENTS

| | | | |
|---|---|---|---|
| 3231557 | 3/1984 | Germany | 257/775 |
| 2-278844 | 11/1990 | Japan | 257/673 |

*Primary Examiner*—Mahshid D. Saadat
*Assistant Examiner*—T. M. Arroyo
*Attorney, Agent, or Firm*—Finnegan, Henderson, Farabow, Garrett & Dunner, L.L.P.

[57] ABSTRACT

In a resin-sealed semiconductor device, leads are respectively connected to a plurality of connection electrodes of a semiconductor chip. The leads include a plurality of inner leads respectively connected to the connection electrodes and a plurality of outer leads, first ends of which are connected to the inner leads and second ends of which are connected to an external device. Distal ends of the inner leads have cut-off thin portions, which define a recess for holding the semiconductor chip. The inner leads and the semiconductor chip are covered by a resin sealing material.

6 Claims, 5 Drawing Sheets

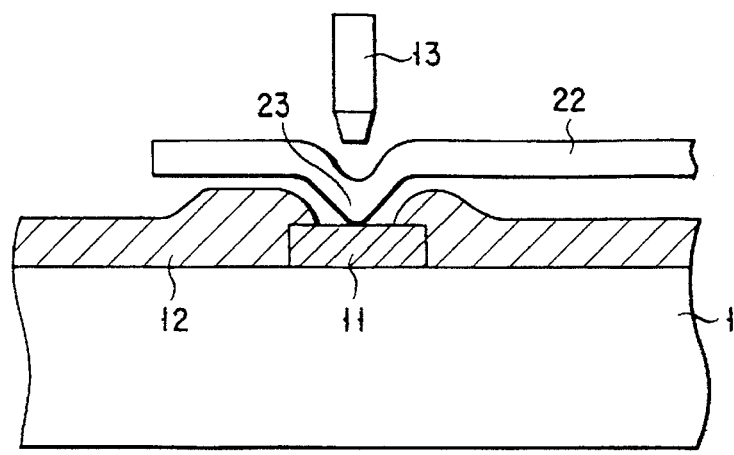
F I G. 6
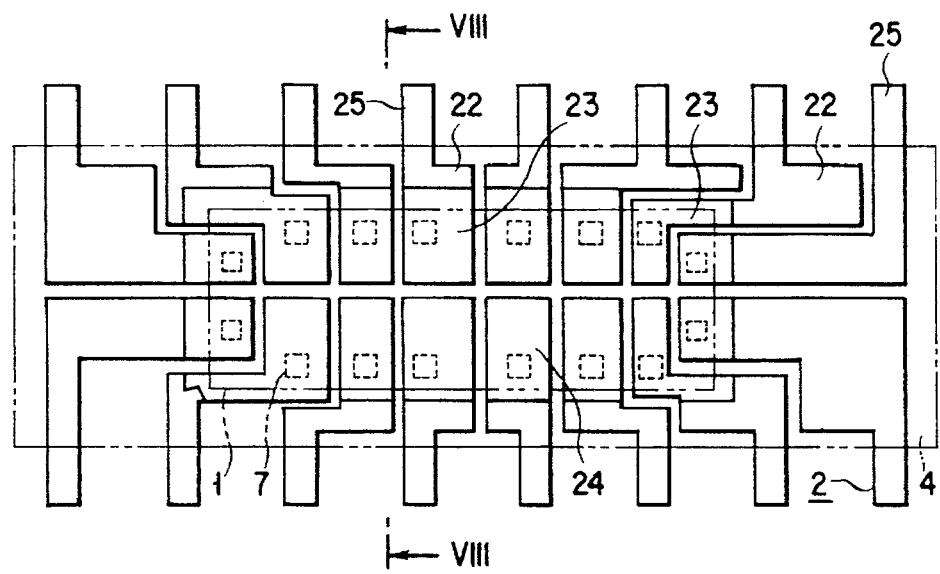
F I G. 7
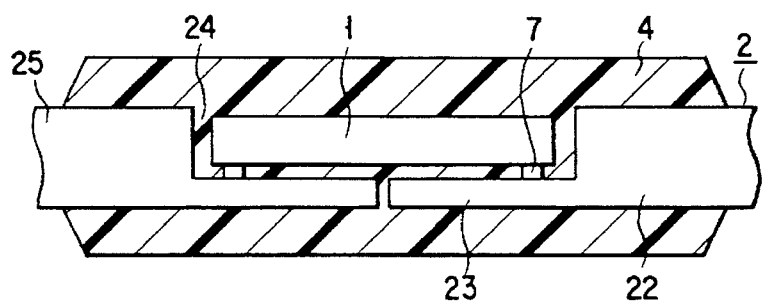
F I G. 8

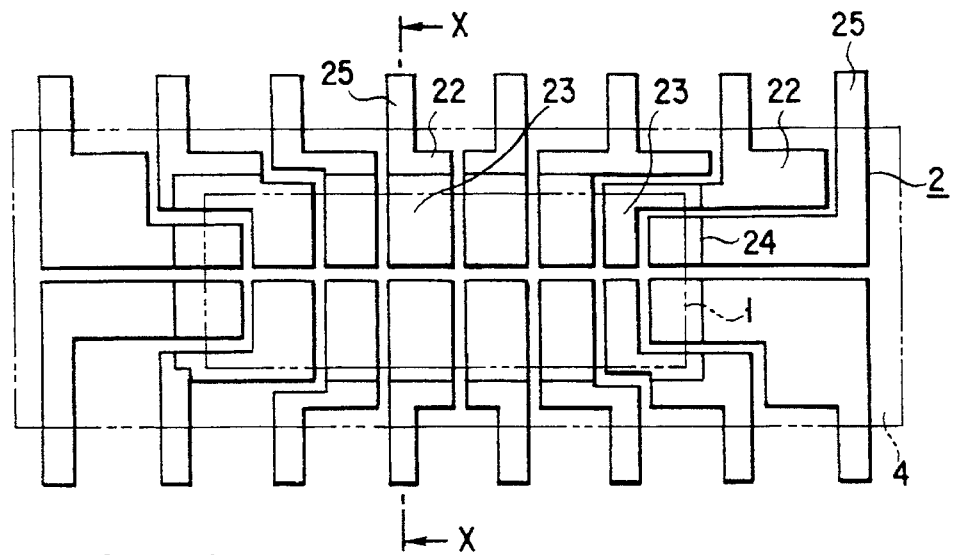
F I G. 9
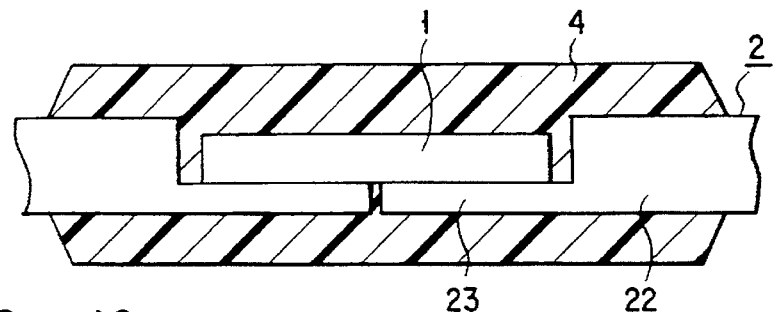
F I G. 10
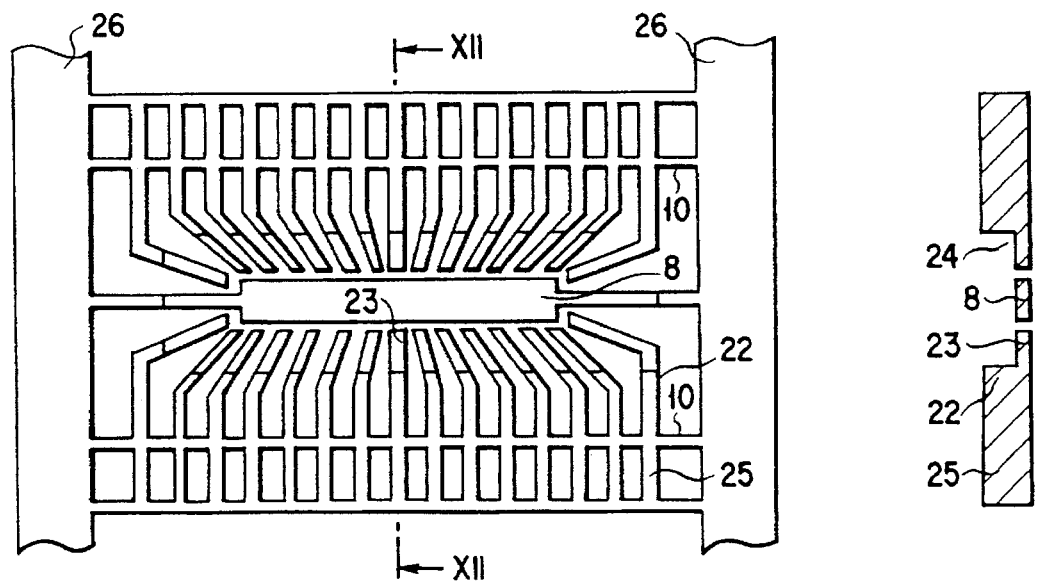
F I G. 11  F I G. 12

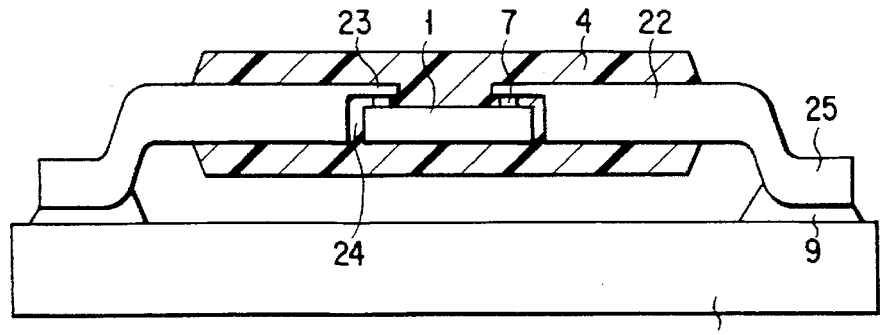
F I G. 13
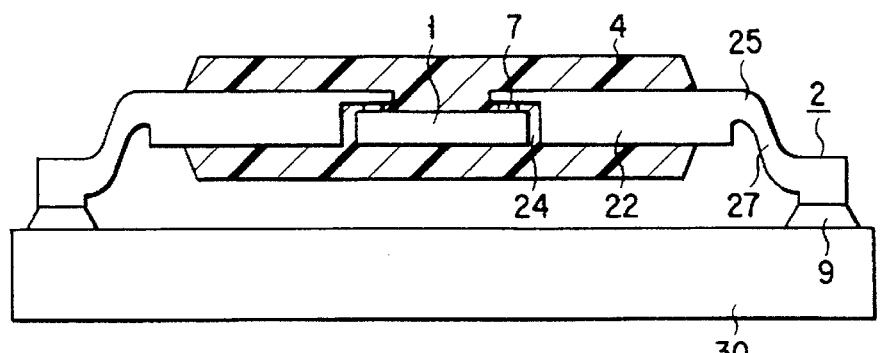
F I G. 14
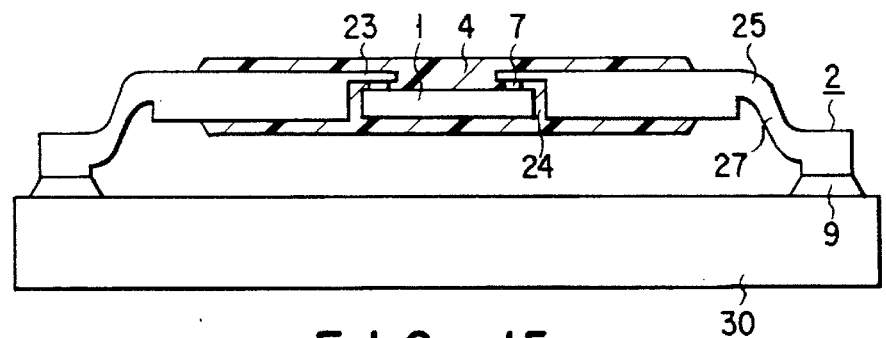
F I G. 15
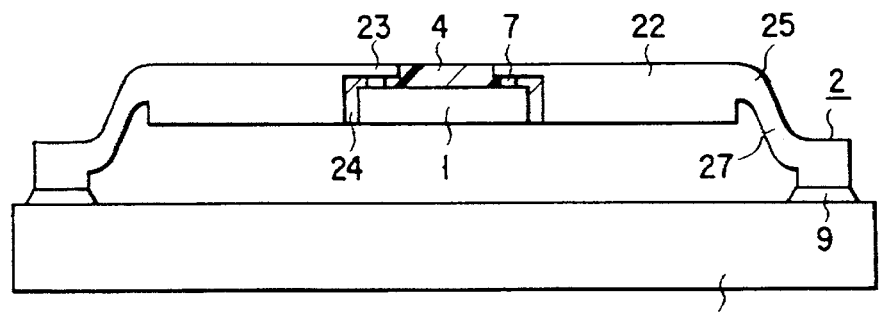
F I G. 16

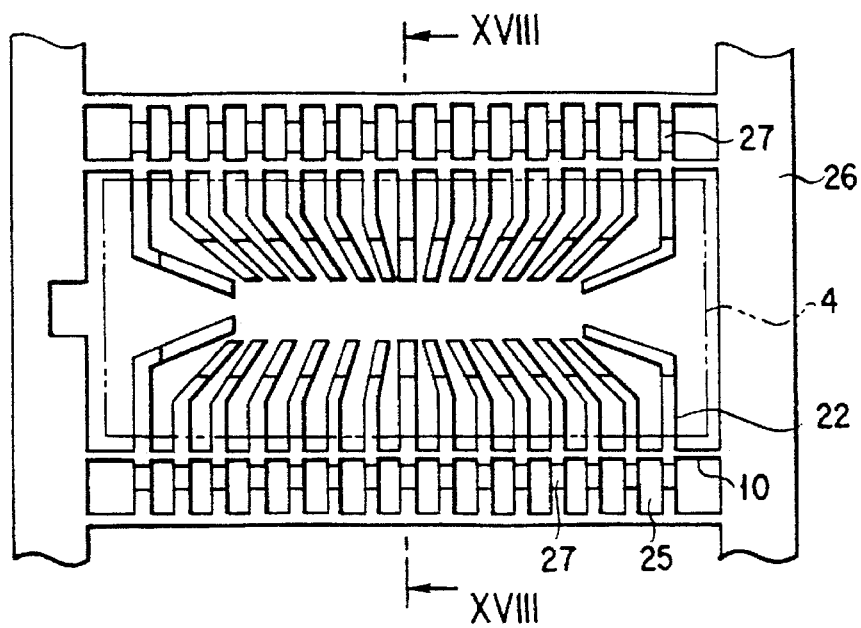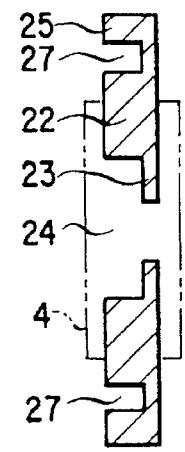
F I G. 17
F I G. 18
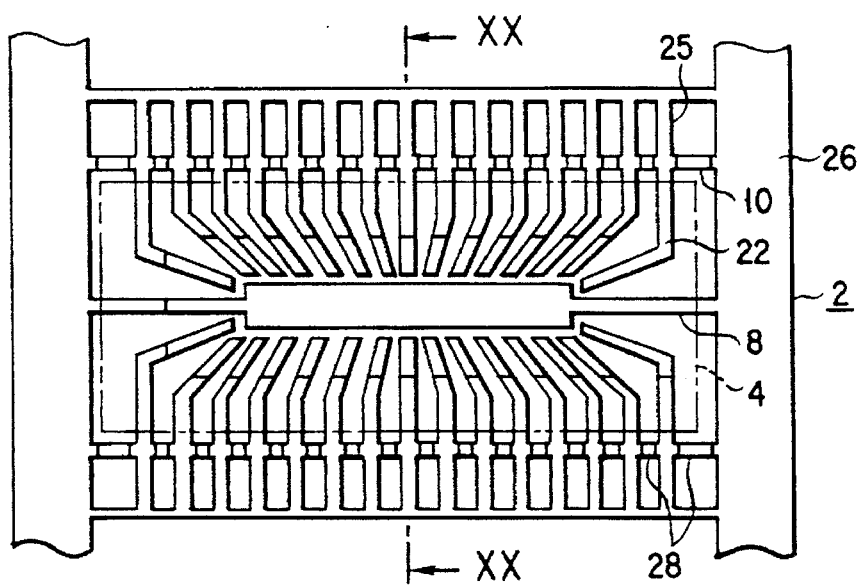
F I G. 19
F I G. 20

RESIN-SEALED SEMICONDUCTOR DEVICE AND LEAD FRAME USED IN A RESIN-SEALED SEMICONDUCTOR DEVICE

BACKGROUND OF THE INVENTION

1. Field of the Invention

The present invention relates to a resin-sealed semiconductor device and a lead frame used in a resin-sealed semiconductor device.

2. Description of the Related Art

A resin-sealed semiconductor device, such as an IC or LSI, is formed through a dicing step for separating semiconductor chips arranged on a wafer, independently from one another, a die bonding step for mounting a separated semiconductor chip on a lead frame, a wire bonding step for connecting an electrode pad on a semiconductor chip with an inner lead of the lead frame through a wire, such as an Au or Al wire, and a packaging step for resin-sealing the semiconductor chip and the wire and the inner lead connected thereto.

In general, the transfer molding method or the potting method is used to resin-seal a semiconductor chip.

FIG. 1 is a partially cross-sectional view of a conventional resin-sealed package, in which a semiconductor element is coated with resin. A conventional resin-sealed semiconductor will be described with reference to FIG. 1.

A semiconductor chip 1, on which an integrated circuit and the like are formed, is bonded to a die pad 21 of a lead frame 2 with adhesive.

A plurality of inner leads 22 are arranged such that their distal ends are opposed to the semiconductor chip 1 with a space. The distal ends of the inner leads 22 are connected to an electrode pad (not shown) formed on the main surface of the semiconductor chip 1 through a bonding wire 3, such as an Au or Al wire.

The semiconductor chip 1, the die pad 21, the bonding wire 3 and the inner leads 22 are sealed with a resin sealing material 4, such as an epoxy resin 4. The unprocessed lead frame 2, on which the semiconductor chip 1 is mounted, is subjected to the resin sealing process. After the lead frame is resin-sealed, an outer lead portion (a portion outside the package (not shown)) of the lead frame is subjected to a forming process. A resin-sealed semiconductor device is thus completed.

A lead frame is generally about 150 μm thick, and can be as thin as 100 μm. The lead frame is made of an Cu alloy or an Fe-42Ni alloy. A semiconductor chip, particularly a silicon chip, is generally about 350 μm thick and it has been attempted to reduce the thickness of a chip to 150 to 200 μm.

The surface of the semiconductor chip 1 is generally coated with a passivation film, such as PSG (Phosphosilicate Glass), $Si_3N_4$ or polyimide.

FIG. 2 is a cross-sectional view showing a conventional thin resin-sealed package.

In FIG. 2, the die pad 21 of the lead frame 2 shown in FIG. 1 is omitted. Side surfaces of a semiconductor chip 1 is adhered to a lead frame 2 with insulating adhesive (not shown).

A plurality of inner leads 22 are arranged such that distal ends thereof are opposed to the semiconductor chip 1 with a space. The distal ends of the inner leads 22 are connected to an electrode pad (not shown) formed on the main surface of the semiconductor chip 1 through a bonding wire 3, such as an Au or Al wire.

The semiconductor chip 1, the bonding wire 3 and the inner leads 22 are sealed with a resin sealing material 4, such as an epoxy resin 4.

FIG. 3 is a cross-sectional view showing another conventional thin resin-sealed package.

A lead is formed by means of a TAB (Tape Automated Bonding) method without using a lead frame.

As regards a TAB lead 5, an inner lead 51 is supported by a polyimide film 6. The distal end of the inner lead 51 of the TAB lead 5 on the polyimide film 6 is connected to a semiconductor chip 1 via a bump (projection electrode) 7 formed on a connection electrode (pad electrode (not shown)).

The semiconductor chip 1, the inner lead 51 and the polyimide film 6 are sealed with a resin sealing material 4, such as an epoxy resin 4.

To reduce the thickness of the conventional resin-sealed package as shown in FIG. 1, the die pad portion of the lead frame 2 is omitted as shown in FIG. 2, or the TAB method is employed as shown in FIG. 3.

When the TAB method is used, it is easy to form a thin resin-sealed package; however, this method itself is expensive. In addition, since a TAB lead is very thin, the outer lead portion (the portion outside the package) is very weak, and problems such as lead bending or lead breakage arise. When the die pad is omitted as shown in FIG. 2 to reduce the thickness of the semiconductor device, if the device is too thin, a bonding wire may be exposed to the outside of the package. Moreover, when the semiconductor chip becomes thinner, the strength of the chip itself it considerably reduced, so that a crack is liable to occur.

Further, to reduce the thickness of the resin-sealed package, reduction of the thickness of the die pad itself has been proposed. However, even if the die pad is thinned, the thickness of the semiconductor chip is not reduced very much and the mechanical strength thereof is lowered. Therefore, it is difficult to hold the semiconductor chip stably.

SUMMARY OF THE INVENTION

The present invention has been made under the above situation, and its object is to provide a thin resin-sealed semiconductor device and a lead frame used in a resin-sealed semiconductor device, without reducing the mechanical strength of the semiconductor chip.

To achieve the above object, the resin-sealed semiconductor device of the present invention comprises:

- a semiconductor chip on which a plurality of connection electrodes are formed;
- leads respectively connected to the plurality of connection electrodes of the semiconductor chip, the leads including a plurality of inner leads respectively connected to the plurality of connection electrodes and a plurality of outer leads, first ends of which are connected to the inner leads and second ends of which are connected to an external device, distal ends of the inner leads having cut-off thin portions, which define a recess for holding the semiconductor chip; and
- a resin sealing material for covering the plurality of inner leads and the semiconductor chip.

A lead frame used in a resin-sealed semiconductor device of the present invention comprises:

- an outer frame; and
- leads respectively connected to a plurality of connection electrodes of a semiconductor chip, the leads including a plurality of inner leads respectively connected to the plurality of connection electrodes and a plurality of outer leads, first ends of which are connected to the inner leads and second ends of which are connected to an external device, distal ends of the inner leads having cut-off thin portions, which define a recess for holding the semiconductor chip.

With the above structure, it is possible to obtain a thin resin-sealed semiconductor device and a lead frame used a the resin-sealed semiconductor device, without reducing the strength of an outer lead and the mechanical strength of the semiconductor chip.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is an enlarged cross-sectional view of part of the resin-sealed semiconductor device of the present invention shown in FIG. 5;

FIG. 7 is a plan view for explaining a resin-sealed semiconductor device according to a third embodiment of the present invention;

FIG. 8 is a cross-sectional view taken along the line VIII—VIII in FIG. 7;

FIG. 9 is a plan view for explaining a resin-sealed semiconductor device according to a fourth embodiment of the present invention;

FIG. 10 is a cross-sectional view taken along the line X—X in FIG. 9;

FIG. 11 is a plan view showing another embodiment of the lead frame of the resin-sealed semiconductor device of the present invention;

FIG. 12 is a cross-sectional view taken along the line XII—XII in FIG. 11;

FIG. 13 is a partially sectioned side view of a lead frame of the resin-sealed semiconductor device according to another embodiment of the present invention;

FIG. 14 is a partially sectioned side view of a lead frame of the resin-sealed semiconductor device according to still another embodiment of the present invention;

FIG. 15 is a partially sectioned side view of a lead frame of the resin-sealed semiconductor device according to still another embodiment of the present invention;

FIG. 16 is a partially sectioned side view of a lead frame of the resin-sealed semiconductor device according to still another embodiment of the present invention;

FIG. 17 is a plan view of a lead frame of the resin-sealed semiconductor device according to another embodiment of the present invention;

FIG. 18 is a cross-sectional view taken along the line XVIII—XVIII in FIG. 17;

FIG. 19 is a plan view of a lead frame of the resin-sealed semiconductor device according to still another embodiment of the present invention; and FIG. 20 is a cross-sectional view taken along the line XX—XX in FIG. 19.

DETAILED DESCRIPTION OF THE PREFERRED EMBODIMENTS

Embodiments of the present invention will be described with reference to the accompanying drawings.

Figure 1:
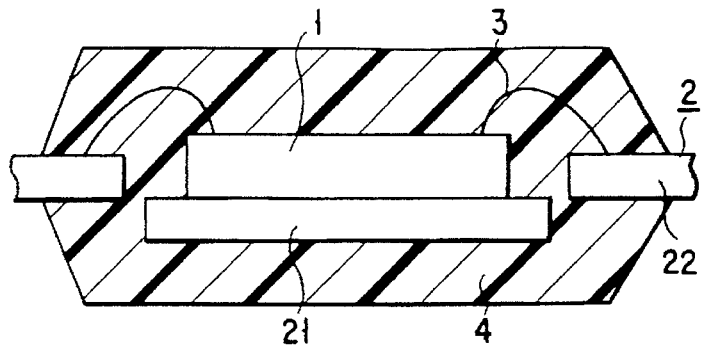
FIG. 1 is a partially cross-sectional view of a conventional resin-sealed semiconductor device.
Figure 2:
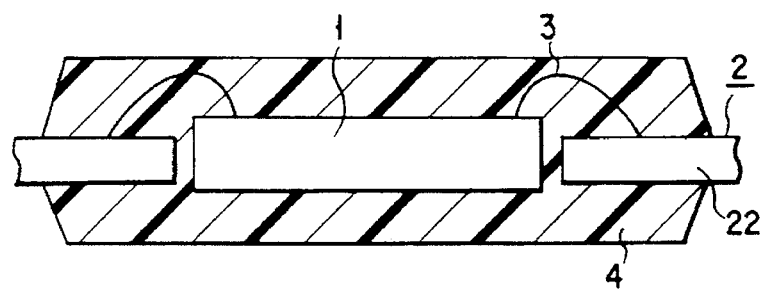
FIG. 2 is a partially cross-sectional view of a conventional thin resin-sealed semiconductor device.
Figure 3:
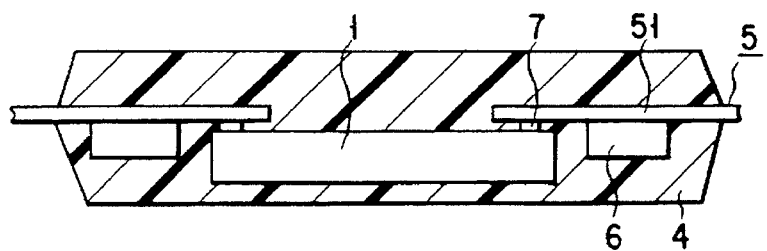
FIG. 3 is a partially cross-sectional view of another conventional thin resin-sealed semiconductor device.
Figure 4:
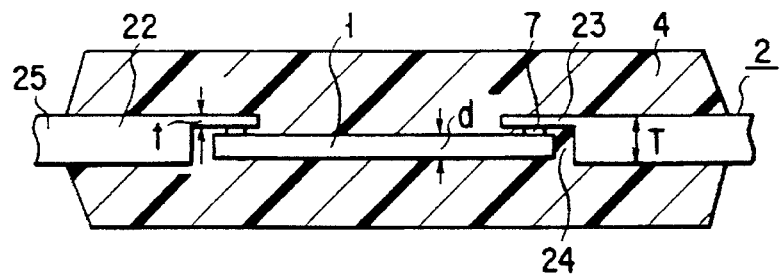
FIG. 4 is a partially cross-sectional view for explaining a resin-sealed semiconductor device according to a first embodiment of the present invention.

FIG. 4 is a partially cross-sectional view for explaining a resin-sealed semiconductor device according to a first embodiment of the present invention.

A plurality of inner leads of a lead frame 2 are formed such that the distal ends thereof are opposed to each other at an interval. A semiconductor chip 1, on which an integrated circuit and the like are formed, is mounted across the distal ends of the opposed inner leads 22.

That portion (thin portion 23) of the lead frame 2, on which the semiconductor chip is to be mounted, is compressed to a thickness t, about one third of a thickness T of the lead frame, by, for example, a press.

A recess 24, i.e., a portion on which the semiconductor chip 1 is to be mounted, is defined by the compressed thin portion 23, having the thickness t, and a thick portion of the lead frame 22 surrounding the thin portion 23.

The semiconductor chip 1 is completely held in the recess 24.

In other words, the semiconductor chip 1 is processed to a thickness d (d<T−t), thinner than two thirds of the thickness of the lead frame 2, so that it can be held within the thickness of the lead frame 2.

In the recess 24, the semiconductor chip 1 is connected to the thin portion 23 of the inner lead 22 via a bump electrode 7 formed of Au or the like. The bump electrode 7 is bonded to a pad electrode (not shown) formed of, for example, Al, exposed through a passivation film on the semiconductor chip 1. The semiconductor chip 1 in the recess 24 and the inner lead 22 are sealed with a resin sealing material 4, such as an epoxy resin.

The resin sealing process is executed by injection molding, such as transfer molding. The unprocessed lead frame, on which a semiconductor chip 1 is formed, is subjected to this process. After the lead frame is resin-sealed, an outer lead portion 25 (a portion outside the package) of the lead frame is subjected to a forming process. A resin-sealed semiconductor device is thus completed.

The lead frame is generally about 150 μm thick, and can be as thin as 100 μm. The lead frame is made of an Cu alloy or an Fe-42Ni alloy. It is preferable that the thickness of a semiconductor chip, particularly a silicon chip, be 100 μm or thinner. The surface of the semiconductor chip is generally coated with a passivation film, such as PSG, $Si_3N_4$ or polyimide.

When the resin portion of the resin sealing material 4 is about 350 μm thick, the thickness of the semiconductor device coated with the resin sealing material according to this embodiment is as thin as 500 μm, since the thickness of the lead frame is 150 μm.

In this embodiment, since the semiconductor chip is arranged so as to be completely held in a space defined by the thin portions of the lead frames, the thickness of the resin-sealed package depends only on the thickness of the lead frame and the resin. Therefore, the thickness of the package can be reduced easily.

A second embodiment of the resin-sealed semiconductor device of the present invention will be described with reference to FIGS. 5 and 6.

In the first embodiment shown in FIG. 4, the semiconductor chip 1 is connected to the thin portion 23 of the inner lead 22 via the bump electrode 7. In contrast, the second embodiment shown in FIG. 5 is characterized in that a bump electrode 7 is not provided and a pad electrode of the semiconductor chip 1 is directly connected to the thin portion 23 of the inner lead 22. The structures of the other portions are the same as those of the embodiment shown in FIG. 4 and the descriptions thereof are omitted.

FIG. 6 is an enlarged partially cross-sectional view showing the connection between the semiconductor chip 1 and the inner lead 22. A pad electrode 11, made of Al or the like, electrically connected to an integrated circuit in the semiconductor chip, is formed on the semiconductor chip 1 made of, for example, silicon.

The surface of the semiconductor chip 1 is generally coated with a passivation film 12. However, that portion, on which the pad electrode 11 is formed, is exposed through the passivation film 12. A tip portion 23 of the inner lead 22 is in contact with the surface of the pad electrode 11 which is exposed, and bonded and electrically connected thereto by thermocompression with a bonding tool 13.

In this case, it is preferable that the inner lead 22 be etched to a thickness thinner than that of the inner lead of the first embodiment, to about 30 µm, i.e., the same thickness as that of a TAB lead. If the inner lead is as thin as a TAB lead as described above, an oxide film on the surface of the pad electrode can easily be removed in a bonding process.

Assuming that the thickness of an existing bump electrode is 20 to 30 µm, the resin-sealed semiconductor device of the second embodiment is 20 to 30 µm thinner than the conventional device, since a bump electrode is omitted.

Figure 5:
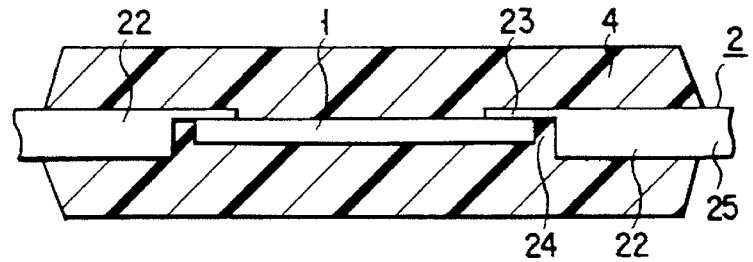
FIG. 5 is a partially cross-sectional view for explaining a resin-sealed semiconductor device according to a second embodiment of the present invention.

As shown in FIG. 5, the semiconductor chip 1 in the recess 24 and the inner lead 22 are sealed with a resin sealing material 4, such as an epoxy resin.

A resin-sealed semiconductor device according to a third embodiment of the present invention will now be described with reference to FIGS. 7 and 8.

As is clear from FIG. 7 (a plan view) and FIG. 8 (a cross-sectional view taken along the line VIII—VIII in FIG. 7), a semiconductor chip 1 is held in a recess 24 defined by thin portions 23 at end portions of inner leads 22 of a lead frame 2.

The semiconductor chip 1 is connected to the thin portions 23 at the end portions of the inner leads 22 via bump electrodes 7 made of Au or the like.

This embodiment is characterized in that the thin portions 23 of the inner leads 22 are arranged side by side, close to one another, and that the ends of the thin portions 23, which are extending from longer sides of the semiconductor chip 1 and facing each other, are arranged linearly. In addition, shorter side portions of the semiconductor chip 1 are partially covered by the end portions of outer leads 25. With this structure, when the semiconductor chip 1 is held in the recess 24, 80% of a surface of the semiconductor chip 1 is covered by the thin portions 23 of the inner leads 22 and the part of the outer leads 25.

The structure of the third embodiment as described above, therefore, effectively holds a semiconductor chip, which has recently become thinner and thinner. Further, the heat radiating efficiency of the semiconductor chip is improved with the above structure.

A fourth embodiment of the resin-sealed semiconductor device of the present invention will be described with reference to FIGS. 9 and 10.

As is clear from FIG. 9 (a plan view) and FIG. 10 (a cross-sectional view taken along the line X—X in FIG. 9), the fourth embodiment is characterized in that a bump electrode 7 is not provided and a pad electrode of a semiconductor chip 1 is directly connected to a thin portion 23 of an inner lead 22. The structures of the other portions are the same as those of the third embodiment shown in FIGS. 7 and 8 and the descriptions thereof are omitted.

A resin-sealed semiconductor device according to another embodiment of the present invention will be described with reference to FIGS. 11 and 12.

As is clear from FIG. 11 (a plan view) and FIG. 12 (a cross-sectional view taken along the line XII—XII in FIG. 11), a lead frame 2 has inner leads 22 and outer leads 25 contiguous to the inner leads 22. These leads are supported by an outer frame 26 via a dam bar 10.

The ends of the inner leads 22, having thin portions 23 obtained by a cutting process, form a recess 24 on which a semiconductor chip 1 is to be mounted. Further, this embodiment is characterized in that a die pad 8 is provided for the ends of the inner leads 22 and supported by the outer frame 26 via the dam bar 10.

The die pad 8 is compressed to about one third of the thickness of the lead frame, by, for example, a press. The semiconductor chip 1 is completely held in the recess 24. In this embodiment also, since the thickness of the resin-sealed package depends only on the thickness of the lead frame and the resin, the package can be thinned easily. Moreover, since the chip-fixing die pad 8 is provided, the semiconductor chip 1 is held securely and the heat radiating efficiency of the semiconductor chip is improved by the area of the die pad 8.

A resin-sealed semiconductor device according to a fifth embodiment of the present invention will be described with reference to FIG. 13.

FIG. 13 is a partially cross-sectional view of the fifth embodiment, in which an outer lead 25 of the resin-sealed semiconductor device of the first embodiment shown in FIG. 4 is bent and connected to a circuit board 30 with a solder 9.

The structure within the resin-sealed material is the same as that of the resin sealed semiconductor device of the first embodiment shown in FIG. 4 and the description thereof is omitted.

The outer lead 25 is connected to the circuit board only at its distal end and the body thereof is suspended and apart from the circuit board. Accordingly, that portion of the outer lead 25, which is connected to the lead 22, and the portion adjacent thereto are horizontal as the inner lead, a portion between these portions and the distal end portion is bent vertically or obliquely downward, and the distal end portion is bent horizontally again and connected to the circuit board 30.

A resin-sealed semiconductor device according to a sixth embodiment of the present invention will be described with reference to FIG. 14.

The embodiment shown in FIG. 14 is the same as the fifth embodiment shown in FIG. 13, in the structure in which the outer lead 25 is bent and connected to the circuit board 30 with the solder 9. However, the resin-sealed semiconductor device of this embodiment is characterized in the shape of the outer lead 25. More specifically, the outer lead 25 includes a thin portion 27, processed to a thickness of about 30 μm, formed between the portion where the outer lead 25 comes out of the resin sealing material 4 and the end portion which is soldered to the circuit board.

Owing to the processed thin portion provided in that portion of the outer lead 25, when the semiconductor device is bonded to the circuit board, it is possible to reduce heat stress, which acts on the connected portion between the semiconductor device and the circuit board due to the difference in coefficient of thermal expansion between metal and resin.

A resin-sealed semiconductor device according to a seventh embodiment of the present invention will be described with reference to FIG. 15.

FIG. 15 is a partially cross-sectional view of a resin-sealed semiconductor device connected to the circuit board. This embodiment is characterized in that the resin-sealing material, both above and under the lead frame, is thinner than the lead frame.

For example, assuming that the lead frame 2 is 150 μm thick and the resin-sealing material 4 above and under the lead frame 2 is 100 μm thick in total, the thickness of the whole resin sealing material 4 coating the semiconductor chip 1 is 250 μm, which is thinner than in the above embodiments. The other structures of the seventh embodiment are the same as those of the sixth embodiment of the resin-sealed semiconductor device of this invention as shown in FIG. 14, and the descriptions thereof are omitted.

A resin-sealed semiconductor device according to another embodiment of the present invention will be described with reference to FIG. 16.

FIG. 16 is a partially cross-sectional view of a resin-sealed semiconductor device connected to the circuit board. This embodiment is characterized in that, in a resin sealing process by means of, for example, the potting method for forming a resin sealing material 4 in a recess 24 holding the semiconductor chip 1, the resin sealing material 4 is formed to a thickness of substantially the same as the thickness of the lead frame, for example, about 150 μm. In this manner, the thickness of the package can be reduced.

The other structures of this embodiment are the same as those of the seventh embodiment of the resin-sealed semiconductor device of this invention as shown in FIG. 15, and the descriptions thereof are omitted. In this embodiment, the resin-sealing material can be any resin other than the epoxy resin, for example, polyimide.

Another embodiment of the lead frame of the present invention will be described with reference to FIGS. 17 and 18.

FIG. 17 is a plan view of a lead frame used in a resin-sealed semiconductor device, and FIG. 18 is a cross-sectional view taken along the line XVIII—XVIII in FIG. 17.

A lead frame 2 has inner leads 22 and outer leads 25 connected to the inner leads 22. These leads are supported by an outer frame 26 via a dam bar 10.

This embodiment is characterized in that each of the outer leads include a thin portion 27. The other structures of this embodiment are the same as those of the above embodiments, and the descriptions thereof are omitted.

Owing to the thin portion 27 provided in a portion of the outer lead 25, when the semiconductor device is bonded to the circuit board, it is possible to reduce heat stress, which acts on the connected portion between the semiconductor device and the circuit board due to the difference in coefficient of thermal expansion between metal and resin.

Still another embodiment of the lead frame of the present invention will be described with reference to FIGS. 19 and 20.

FIG. 19 is a plan view of a lead frame used in a resin-sealed semiconductor device, and FIG. 20 is a cross-sectional view taken along the line XX—XX in FIG. 19.

This embodiment is characterized in that a chip fixing die pad 8, in addition to a thin portion 23 of the inner lead 22, is provided in a portion for holding the chip 1.

It is also characterized in that a dam bar 10 has a thin portion 28.

The chip fixing die pad 8 is supported by an outer frame 26.

Since the chip fixing die pad 8 is added to the recess 24, the semiconductor chip 1 is held securely and the heat radiating efficiency of the semiconductor chip is improved. Further, since the dam bar 10 has the thin portion, it can be cut off easily.

In the above embodiments, a resin-sealing material of a type, in which leads are drawn out in two directions, is used. However, the present invention is not limited to this type but can be applied to a resin-sealing material of a type in which leads are drawn out in four directions.

In the resin-sealed semiconductor device and the lead frame used in the device according to the present invention having the above structure, a thin portion can be formed in a distal end portion of the inner lead without reducing the thickness of the lead frame as a whole. Accordingly, an ultrathin resin-sealed package can be obtained without reducing the strength of the lead frame itself.

Further, although processing of the lead frame to a thin film by etching is inferior to pressing in terms of strength, it can produce a thinner lead frame. Therefore, the lead frame can be connected directly to an electrode of the semiconductor chip without a projection, such as a bump, on the electrode portion of the semiconductor chip.

The ratio of the area occupied by the inner leads to the area of the portion of the lead frame, on which a chip is to be mounted, is as great as possible. In other words, the thin portion of the lead frame covers the semiconductor chip to an extent as much as possible. In this manner, even if an external shock is applied to the resin-sealed device, the extended lead frame receives the shock, so that the strength with respect to the semiconductor chip is increased and the heat radiating efficiency of the semiconductor chip is improved.

Furthermore, the chip fixing die pad is provided for the thin portion of the lead frame, thereby increasing the strength with respect to the semiconductor chip and the heat radiating efficiency.

Moreover, the outer lead of the lead frame also includes a thin portion to overcome a problem of thermal fatigue which arises owing to the difference between contraction of the package and contraction of the substrate due to a change in temperature. The thin portion easily absorbs the difference in contraction, so that the fatigue strength of the soldered portion can be increased.

Furthermore, the dam bar portion of the lead frame also includes a thin portion, so that the dam bar can be easily cut off.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A resin-sealed semiconductor device comprising:

a semiconductor chip on which a plurality of connection electrodes are formed;

leads respectively connected to said plurality of connection electrodes of said semiconductor chip, said leads including a plurality of inner leads respectively connected to said plurality of connection electrodes and a plurality of outer leads having first ends connected to the inner leads and second ends connected to an external device, distal ends of said inner leads having cut-off thin portions, which define a recess for holding said semiconductor chip; and a resin sealing material for covering said plurality of inner leads and said semiconductor chip, wherein a thickness T of said inner leads, a thickness t of the cut-off thin portions at the distal ends of said inner leads, and a thickness d of said semiconductor chip have a relationship d<T−t.

2. The resin-sealed semiconductor device according to claim 1, wherein when said semiconductor chip is held in the recess defined by the thin portions at the distal ends of said plurality of inner leads, a surface of each of said inner leads lying in a plane defined by a surface of said semiconductor chip.

3. A lead frame used in a resin-sealed semiconductor device comprising:

an outer frame; and leads respectively connected to a plurality of connection electrodes of a semiconductor chip, said leads including a plurality of inner leads respectively connected to said plurality of connection electrodes and a plurality of outer leads having first ends connected to the inner leads and second ends connected to an external device, distal ends of said inner leads having cut-off thin portions, which define a recess for holding said semiconductor chip, wherein a thickness T of said inner leads, a thickness t of the cut-off thin portions at the distal ends of said inner leads, and a thickness d of said semiconductor chip have a relationship d<T−t.

4. The lead frame used in a resin-sealed semiconductor device according to claim 3, wherein a die pad on which said semiconductor chip is mounted, is formed between the distal ends of the thin portions of the inner leads, which distal ends are opposed in two groups, and a dam bar supported by said outer frame supports the die pad.

5. A resin-sealed semiconductor device comprising:

a semiconductor chip on which a plurality of connection electrodes are formed;

leads respectively connected to said plurality of connection electrodes of said semiconductor chip, said leads including a plurality of inner leads having relatively thinned distal portions respectively connected to said plurality of connection electrodes and a plurality of outer leads having first ends connected to the inner leads and second ends for external connection, said distal ends of said inner leads defining a recess for holding said semiconductor chip; and a resin sealing material for covering said plurality of inner leads and said semiconductor chip, wherein a thickness T of said inner leads, a thickness t of the cut-off thin portions at the distal ends of said inner leads, and a thickness d of said semiconductor chip have a relationship d<T−t.

6. A lead frame used in a resin-sealed semiconductor device comprising:

an outer frame; and leads respectively connected to a plurality of connection electrodes of a semiconductor chip, said leads including a plurality of inner leads having relatively thinned distal ends respectively connected to said plurality of connection electrodes and a plurality of outer leads having first ends connected to the inner leads and second ends for external connection, said distal ends of said inner leads defining a recess for holding said semiconductor chip, wherein a thickness T of said inner leads, a thickness t of the cut-off thin portions at the distal ends of said inner leads, and a thickness d of said semiconductor chip have a relationship d<T−.

* * * * *

UNITED STATES PATENT AND TRADEMARK OFFICE
CERTIFICATE OF CORRECTION

PATENT NO. : 5,648,682
DATED : July 15, 1997
INVENTOR(S) : Tsutomu NAKAZAWA et al.

It is certified that error appears in the above-indentified patent and that said Letters Patent is hereby corrected as shown below:

In Claim 6, Col. 10, line 43, "d<T-." should read --d<T-t.--.

Signed and Sealed this

Fourteenth Day of October, 1997

Attest:

BRUCE LEHMAN

Attesting Officer

Commissioner of Patents and Trademarks